(12) United States Patent
Takahama (10) Patent No.: US 9,059,340 B2
(45) Date of Patent: Jun. 16, 2015

(54) METHOD OF MANUFACTURING SOLAR CELL AND SOLAR CELL

(71) Applicant: Sanyo Electric Co., Ltd., Moriguchi, Osaka (JP)

(72) Inventor: Tsuyoshi Takahama, Neyagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 13/928,959

(22) Filed: Jun. 27, 2013

(65) Prior Publication Data

US 2013/0288423 A1    Oct. 31, 2013

Related U.S. Application Data

(63) Continuation of application No. PCT/JP2011/077779, filed on Dec. 1, 2011.

(30) Foreign Application Priority Data

Dec. 29, 2010 (JP) .................................. 2010-294548

(51) Int. Cl.
| | | |
|---|---|---|
| H01L 21/00 | (2006.01) | |
| H01L 31/0224 | (2006.01) | |
| H01L 31/068 | (2012.01) | |
| H01L 31/0747 | (2012.01) | |
| H01L 31/0352 | (2006.01) | |

(52) U.S. Cl.
CPC .... *H01L 31/022441* (2013.01); *H01L 31/0682* (2013.01); *H01L 31/0747* (2013.01); *Y02E 10/547* (2013.01); *H01L 31/03529* (2013.01)

(58) Field of Classification Search
CPC ............ H01L 31/0682; H01L 31/0747; H01L 31/03529; Y02E 10/547
USPC .................................................. 438/268–270
See application file for complete search history.

(56) References Cited

U.S. PATENT DOCUMENTS

| | | | |
|---|---|---|---|
| 8,796,539 B2 * | 8/2014 | Asaumi et al. ................ | 136/256 |
| 2008/0035198 A1 | 2/2008 | Teppe et al. | |
| 2010/0263722 A1 | 10/2010 | Kubo et al. | |
| 2011/0000532 A1 | 1/2011 | Niira et al. | |

FOREIGN PATENT DOCUMENTS

| | | |
|---|---|---|
| JP | 2008-517451 A | 5/2008 |
| JP | 2010-80887 A | 4/2010 |
| JP | 2010-258043 A | 11/2010 |
| WO | 2009/096539 A1 | 8/2009 |
| WO | 2010/113750 A1 | 10/2010 |

\* cited by examiner

*Primary Examiner* — Richard Booth
(74) *Attorney, Agent, or Firm* — Marvin A. Motsenbocker; Mots Law, PLLC (57) ABSTRACT

Provided is a method capable of easily manufacturing a back contact solar cell with high photoelectric conversion efficiency. A semiconductor layer having a first conductivity which is the same as that of a semiconductor substrate is formed substantially entirely on the principal surface of the semiconductor substrate inclusive of a surface of an insulation layer. A portion of the semiconductor layer located on the insulation layer is removed, and thereby an opening is formed. The insulation layer exposed through the opening is removed while the semiconductor layer is used as a mask, and thereby a surface of a first semiconductor region is partially exposed. Electrodes which are electrically connected to the surface of the first semiconductor region and to a surface of the semiconductor layer respectively are formed.

9 Claims, 9 Drawing Sheets

FIG. 16

METHOD OF MANUFACTURING SOLAR CELL AND SOLAR CELL

CROSS REFERENCE

This application is a Continuation of PCT Application No. PCT/JP2011/077779 filed on Dec. 1, 2011, and claims the priority of Japanese Patent Application No. 2010-294548 filed on Dec. 29, 2010, the content of both of which is incorporated herein by reference.

TECHNICAL FIELD

The invention relates to a method of manufacturing a solar cell and a solar cell. In particular, the invention relates to a method of manufacturing a back contact solar cell and a back contact solar cell.

BACKGROUND ART

Heretofore, a so-called back contact solar cell having p-type and n-type semiconductor regions arranged on a back surface side of the solar cell has been known (Patent Document 1 described below, for example). In this back contact solar cell, a light-receiving surface side does not need to be provided with electrodes. For this reason, the back contact solar cell can increase light reception efficiency, and thereby can achieve higher photoelectric conversion efficiency. In addition, connection between solar cells with a wiring member can be performed only on the back surface side. Hence, light reception loss attributable to a wiring member can be reduced. Thus, a solar cell module with increased output can be provided.

Figure 14:
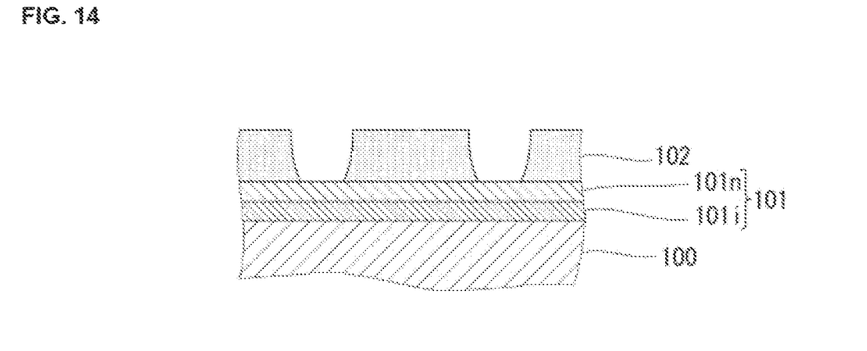
FIG. 14 is a schematic cross-sectional view for describing steps of manufacturing a solar cell described in Patent Document 1.

For example, Patent Document 1 discloses the following manufacturing method as a method of manufacturing a back contact solar cell. Specifically, first of all, in junction layer 101, which is formed of a layered body of i-type semiconductor layer 101i and n-type semiconductor layer 101n, and covering layer 102 are formed in this order on a back surface of n-type monocrystalline silicon substrate 100, as illustrated in FIG. 14. Then, covering layer 102 is partially removed by an etching method.

Figure 15:
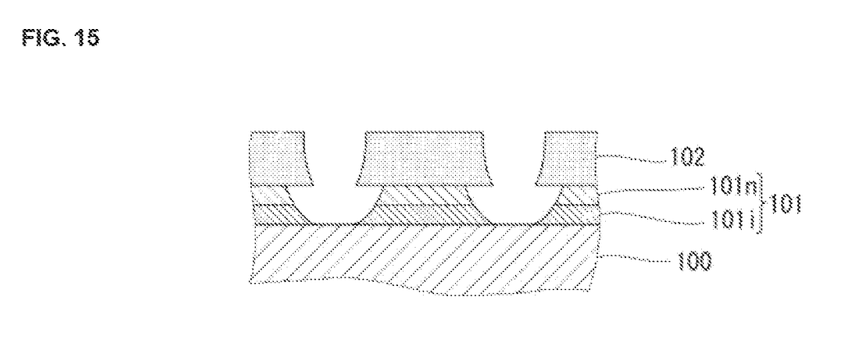
FIG. 15 is a schematic cross-sectional view for describing the steps of manufacturing the solar cell described in Patent Document 1.
Figure 16:
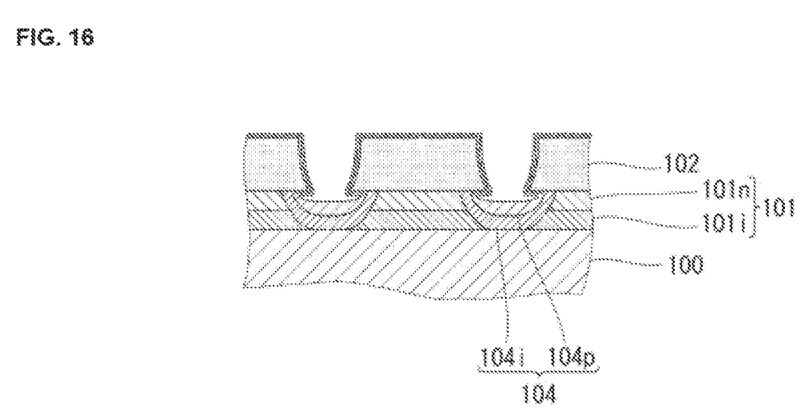
FIG. 16 is a schematic cross-sectional view for describing the steps of manufacturing the solar cell described in Patent Document 1.

Next, as illustrated in FIG. 15, in junction layer 101 is partially removed by the etching method while partially etched covering layer 102 is used as a mask. After that, as illustrated in FIG. 16, ip junction layer 104 formed of a layered body of i-type semiconductor layer 104i and p-type semiconductor layer 104p is formed. Then, a portion of in junction layer 101 covered with covering layer 102 is exposed by removing covering layer 102 with etching. Lastly, an n-side electrode is formed on in junction layer 101 and a p-side electrode is formed on ip junction layer 104, whereby a back contact solar cell is completed.

PRIOR ART DOCUMENT

Patent Document

Patent Document 1: Japanese Patent Application Publication No. 2010-80887

SUMMARY OF THE INVENTION

Problems to be Solved by the Invention

In the method of manufacturing a back contact solar cell described in Patent Document 1, the removal of covering layer 102 with etching requires a long time, and thus the manufacturing of a back contact solar cell requires a long time. Besides, it is difficult to certainly remove covering layer 102 with etching.

The invention is made in view of the above point, and aims to provide a method capable of easily manufacturing a back contact solar cell with high photoelectric conversion efficiency, and a back contact solar cell with high photoelectric conversion efficiency which can be manufactured easily.

Means for Solving the Problems

In a first method of manufacturing a solar cell according to the invention, a semiconductor substrate of first conductivity is prepared which includes: a first semiconductor region of second conductivity provided in a portion of a principal surface of the semiconductor substrate; and an insulation layer provided on a surface of the first semiconductor region. A second semiconductor layer of the first conductivity is formed on substantially entirely on the principal surface inclusive of a surface of the insulation layer. A portion of the second semiconductor layer located on the insulation layer is removed, and thereby an opening is formed. The insulation layer exposed through the opening is removed while the second semiconductor layer is used as a mask, and thereby the surface of the first semiconductor region is partially exposed. Electrodes which are electrically connected to the surface of the first semiconductor region and to a surface of the second semiconductor layer respectively are formed.

In a second method of manufacturing a solar cell according to the invention, a semiconductor substrate is prepared which includes: a first semiconductor region of first conductivity; and a second semiconductor region of second conductivity. Electrodes are formed on a surface of the first semiconductor region and on a surface of the second semiconductor region, respectively. In the step of forming the electrodes, a first conductive layer made of transparent conductive oxide is formed by a sputtering method or a CVD method, and a second conductive layer made of metal or an alloy is formed by a plating method.

A solar cell according to the invention includes a semiconductor substrate, an insulation layer, a second semiconductor layer, a first electrode, and a second electrode. The semiconductor substrate is of first conductivity. A first semiconductor region of second conductivity is provided in a portion of a principal surface of the semiconductor substrate. The insulation layer is provided on each of both end portions of the first semiconductor region exclusive of a central portion. The second semiconductor layer is provided to extend over a portion of the principal surface of the semiconductor substrate, which is adjacent to the first semiconductor region, and at least a portion of the insulation layer. The second semiconductor layer is of the first conductivity. The first electrode is provided on a surface of the first semiconductor region. The second electrode is provided on a surface of the second semiconductor layer.

Effects of the Invention

According to the invention, it is possible to provide a method capable of easily manufacturing a back contact solar cell with high photoelectric conversion efficiency, and a back contact solar cell with high photoelectric conversion efficiency which can be manufactured easily.

MODES FOR CARRYING OUT THE INVENTION

Hereinafter, an example of preferred embodiments of the invention is described. Note, however, that the embodiments described below are merely an example. The invention is not limited to the embodiments below in any way.

In addition, in the drawings referenced in the embodiments and the like, members having substantially the same function are given the same reference numeral. Further, the drawings referenced in the embodiments and the like are schematic. Hence, dimensional ratios and the like of objects depicted in the drawings may be different from actual dimensional ratios and the like of the objects. The dimensional ratios and the like of the objects in the drawings maybe different among the drawings as well. Thus, specific dimensional ratios and the like of the objects should be determined in consideration of the following description.

<First Embodiment>

(Configuration of Solar Cell 1)

Figure 1:
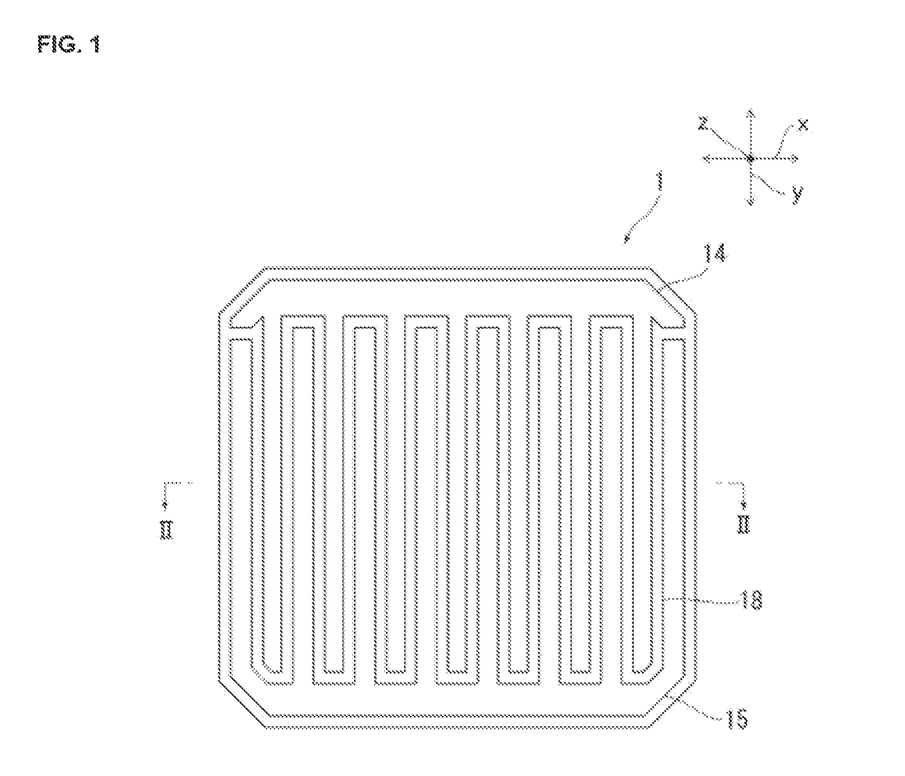
FIG. 1 is a schematic plan view of a solar cell according to a first embodiment.

First of all, the configuration of solar cell 1 manufactured in this embodiment is described in detail with reference to Figs. 1 and 2.

Solar cell 1 is a back contact solar cell. Note that, if a sufficient output cannot be obtained from single solar cell 1 of this embodiment, a solar cell module made by connecting multiple solar cells 1 with wiring members may be used.

Solar cell 1 includes semiconductor substrate 10. Semiconductor substrate 10 includes light-receiving surface 10a and back surface 10b. Semiconductor substrate 10 generates carriers by receiving light 11 on light-receiving surface 10a. Here, carriers denote holes and electrons generated when light is absorbed by semiconductor substrate 10.

Semiconductor substrate 10 is formed of a crystalline semiconductor of n-type or p-type conductivity. Specific examples of the crystalline semiconductor include crystalline silicon such as monocrystalline silicon and polycrystalline silicon, for example. Note that, in the invention, the semiconductor substrate is not limited to a substrate made of such a crystalline semiconductor. In the invention, the semiconductor substrate may be a substrate made of a compound semiconductor made of GaAs, InP, or the like, for example. Hereinbelow, in this embodiment, a description is given of an example in which semiconductor substrate 10 is formed of n-type monocrystalline silicon.

I-type amorphous semiconductor layer 17i made of an intrinsic amorphous semiconductor (an intrinsic semiconductor is hereinafter referred to as an "i-type semiconductor") is provided on light-receiving surface 10a of semiconductor substrate 10. In this embodiment, i-type amorphous semiconductor layer 17i is specifically made of i-type amorphous silicon containing hydrogen. The thickness of i-type amorphous semiconductor layer 17i is not particularly limited as long as it does not virtually contribute to power generation. The thickness of i-type amorphous semiconductor layer 17i may be set at several angstroms to 250 angstroms, for example.

Note that, an "amorphous semiconductor" in the invention includes a microcrystalline semiconductor. A microcrystalline semiconductor indicates an amorphous semiconductor including a large number of fine crystal grains. An average grain diameter of each crystal grain is within a range of 1 nm to 50 nm, for example.

N-type amorphous semiconductor layer 17n having the same conductivity as semiconductor substrate 10 is provided on i-type amorphous semiconductor layer 17i. In this embodiment, n-type amorphous semiconductor layer 17n and i-type amorphous semiconductor layer 17i described above form a passivation film. Hence, in this embodiment, the passivation film is formed of an amorphous silicon layer containing hydrogen.

N-type amorphous semiconductor layer 17n is an amorphous semiconductor layer doped with an n-type dopant and having an n-type conductivity. Specifically, in this embodiment, n-type amorphous semiconductor layer 17n is made of n-type amorphous silicon containing hydrogen. The thickness of n-type amorphous semiconductor layer 17n is not particularly limited. The thickness of n-type amorphous semiconductor layer 17n may be set at about 20 angstroms to 500 angstroms, for example.

Insulation layer 16 serving both as an antireflection film and a protection film is provided on n-type amorphous semiconductor layer 17n. Insulation layer 16 may be made of silicon oxide, silicon nitride, silicon oxynitride, or the like, for example. Alternatively, insulation layer 16 may be formed of a layered body of multiple films made of silicon oxide, silicon nitride, silicon oxynitride, and the like. The thickness of insulation layer 16 may be set as appropriate according to antireflection characteristics intended to be given to this layer. The thickness of insulation layer 16 may be set at about 80 nm to 1 μm, for example.

The layered structure of i-type amorphous semiconductor layer 17i, n-type amorphous semiconductor layer 17n, and insulation layer 16 described above serves both as a passivation layer and an antireflection film for semiconductor substrate 10. Light 11 is transmitted through the layered structure of i-type amorphous semiconductor layer 17i, n-type amorphous semiconductor layer 17n, and insulation layer 16, and enters semiconductor substrate 10.

P-type amorphous semiconductor layer 12p having a different conductivity from that of semiconductor substrate 10 and n-type amorphous semiconductor layer 13n having the same conductivity as that of semiconductor substrate 10 are provided on back surface 10b of semiconductor substrate 10. In this embodiment, p-type amorphous semiconductor layer 12p as a first semiconductor layer constitutes a p-type semiconductor region (a first semiconductor region), and n-type amorphous semiconductor layer 13n constitutes a second semiconductor layer.

Portions where p-type amorphous semiconductor layer 12p is in contact with back surface 10b and portions where n-type amorphous semiconductor layer 13n is in contact with back surface 10b are arranged alternately in an x direction. P-type amorphous semiconductor layer 12p and n-type amorphous semiconductor layer 13n adjacent in the x direction are in contact with each other. Thus, p-type amorphous semiconductor layer 12p and n-type amorphous semiconductor layer 13n cover substantially entirely on back surface 10b of semiconductor substrate 10.

Here, each of width W1 of p-type amorphous semiconductor layer 12p and interval W2 of n-type amorphous semiconductor layer 13n may be set at about 100 μm to 1.5 mm, for example. Width W1 and interval W2 may be equal to and may be different from each other, but width W1 is preferably larger than width W2. Specifically, width W1 is preferably 1.1 times or more larger than, and more preferably 1.5 times or more larger than width W2.

P-type amorphous semiconductor layer 12p is an amorphous semiconductor layer doped with a p-type dopant and having a p-type conductivity. Specifically, in this embodiment, p-type amorphous semiconductor layer 12p is made of p-type amorphous silicon containing hydrogen. The thickness of p-type amorphous semiconductor layer 12p is not particularly limited. The thickness of p-type amorphous semiconductor layer 12p may be set at about 20 angstroms to 500 angstroms, for example.

In this embodiment, i-type amorphous semiconductor layer 12i having a thickness of about several angstroms to 250 angstroms for example, which virtually does not contribute to power generation, is provided between p-type amorphous semiconductor layer 12p and back surface 10b. In this embodiment, i-type amorphous semiconductor layer 12i is made of amorphous silicon containing hydrogen. Providing such i-type amorphous semiconductor layer 12i makes it possible to further suppress recombination of carriers.

Insulation layer 18 is provided on each of both end portions of p-type amorphous semiconductor layer 12p exclusive of a central portion in the x direction. The central portion of p-type amorphous semiconductor layer 12p in the x direction is exposed outside insulation layer 18. Width W3 of each insulation layer 18 in the x direction is not particularly limited, but may be set at about one-third of width W1, for example. Interval W4 between insulation layers 18 in the x direction is also not particularly limited, but may be set at about one-third of width W1, for example.

A material of insulation layer 18 is not particularly limited. For example, insulation layer 18 may be made of silicon oxide, silicon nitride, silicon oxynitride, or the like. Among these, insulation layer 18 is preferably made of silicon nitride. Further, insulation layer 18 preferably contains no hydrogen.

N-type amorphous semiconductor layer 13n is provided to extend over a portion of back surface 10b exposed outside p-type amorphous semiconductor layer 12p, and end portions of insulation layer 18. In other words, n-type amorphous semiconductor layer 13n is provided to extend over a portion of back surface 10b adjacent to the first semiconductor region formed by p-type amorphous semiconductor layer 12p, and the end portions of insulation layer 18. Accordingly, both end portions of n-type amorphous semiconductor layer 13n in the x direction overlap p-type amorphous semiconductor layer 12p in a thickness direction (z direction) with insulation layer 18 interposed therebetween.

N-type amorphous semiconductor layer 13n is doped with an n-type dopant. N-type amorphous semiconductor layer 13n therefore has an n-type conductivity which is the same as that of semiconductor substrate 10. Specifically, in this embodiment, n-type amorphous semiconductor layer 13n is made of n-type amorphous silicon containing hydrogen. The thickness of n-type amorphous semiconductor layer 13n is not particularly limited.

The thickness of n-type amorphous semiconductor layer 13n may be set at about 20 angstroms to 500 angstroms, for example.

In this embodiment, i-type amorphous semiconductor layer 13i having a thickness of about several angstroms to 250 angstroms for example, which virtually does not contribute to power generation, is provided between n-type amorphous semiconductor layer 13n and back surface 10b and between n-type amorphous semiconductor layer 13n and insulation layer 18. In this embodiment, i-type amorphous semiconductor layer 13i is made of i-type amorphous silicon containing hydrogen. Providing such i-type amorphous semiconductor layer 13i makes it possible to further suppress recombination of carriers.

Note that, in the invention, i-type amorphous semiconductor layer 13i and i-type amorphous semiconductor layer 12i described above are not essential constituents. In the invention, an i-type semiconductor layer does not necessarily have to be provided between the semiconductor substrate and the n-type or p-type semiconductor layer.

N-side electrode (second electrode) 15 for collecting electrons is provided on n-type amorphous semiconductor layer 13n, whereas p-side electrode (first electrode) 14 for collecting holes is provided on p-type amorphous semiconductor layer 12p.

P-side electrode 14 and n-side electrode 15 are electrically isolated from each other on insulation layer 18. Here, interval W5 between n-side electrode 15 and p-side electrode 14 on insulation layer 18 may be set at about one-third of width W3, for example.

In this embodiment, each of n-side electrode 15 and p-side electrode 14 is formed of a comb-teeth-shaped electrode including a bus bar and multiple fingers. Instead, each of n-side electrode 15 and p-side electrode 14 may be a so-called bus-bar-less electrode formed only of multiple fingers without a bus bar.

The configuration of each of n-side electrode 15 and p-side electrode 14 is not particularly limited as long as these are capable of collecting carriers generated in semiconductor substrate 10. In this embodiment, each of n-side electrode 15 and p-side electrode 14 is formed of a layered body of first to fourth conductive layers 19a to 19d.

First conductive layer 19a may be made of transparent conductive oxide (TCO) such as ITO (indium tin oxide), for example. Specifically, in this embodiment, first conductive layer 19a is made of ITO. The thickness of first conductive layer 19a may be set at about 50 to 100 nm.

Second to fourth conductive layers 19b to 19d may be made of metal, such as Cu, or an alloy. Specifically, in this embodiment, each of second and third conductive layers 19b, 19c is made of Cu, and fourth conductive layer 19d is made of Sn. Thicknesses of second to fourth conductive layers 19b to 19d may be set at about 50 nm to 1 μm, about 10 μm to 20 μm, and about 1 μm to 5 μm, respectively.

Here, a method of forming each of first to fourth conductive layers 19a to 19d is not particularly limited. Each of first to fourth conductive layers 19a to 19d may be formed by, for example, a thin-film formation method such as a sputtering method and a CVD method, a plating method, and the like. Specifically, in this embodiment, first and second conductive layers 19a, 19b are films formed by the thin-film formation method, and third and fourth conductive layers 19c, 19d are films formed by the plating method.

Next, a description is given of a method of manufacturing solar cell 1 of this embodiment while mainly referring to FIGS. 3 to 12.

Figure 3:
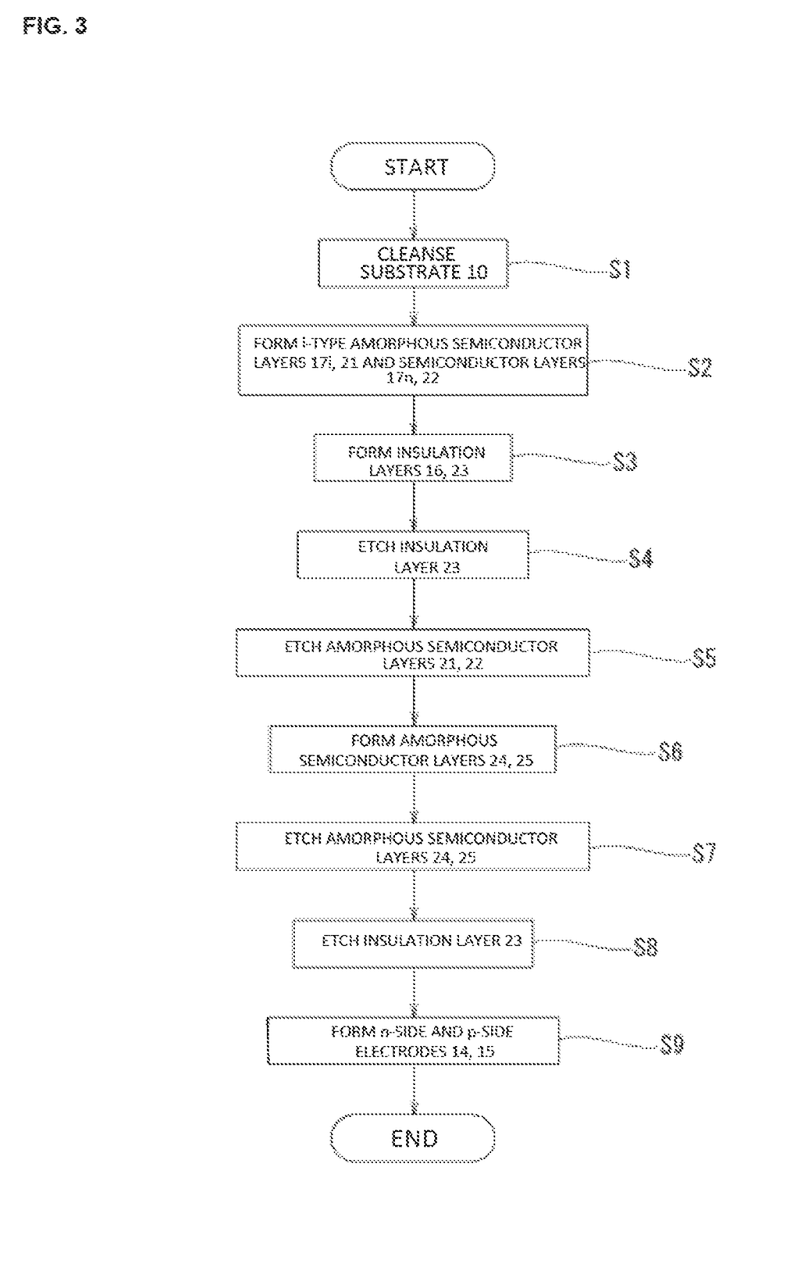
FIG. 3 is a flowchart showing steps of manufacturing the solar cell according to the first embodiment.
Figure 4:
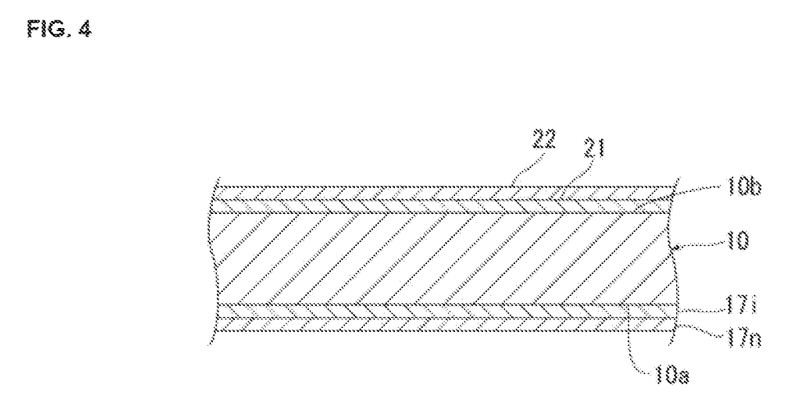
FIG. 4 is a schematic cross-sectional view for describing the steps of manufacturing the solar cell according to the first embodiment.

First of all, semiconductor substrate 10 is prepared. Next, in Step S1, light-receiving surface 10a and back surface 10b of semiconductor substrate 10 are cleansed. Semiconductor substrate 10 may be cleansed using an HF aqueous solution, for example. Here, it is preferable to form a texture structure in light-receiving surface 10a in Step S1.

Figure 5:
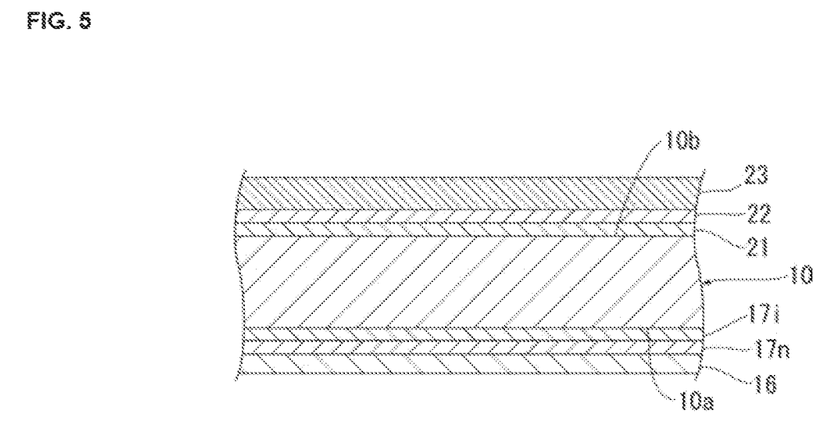
FIG. 5 is a schematic cross-sectional view for describing the steps of manufacturing the solar cell according to the first embodiment.

Subsequently, in Step S2, i-type amorphous semiconductor layer 17i and n-type amorphous semiconductor layer 17n are formed on light-receiving surface 10a of semiconductor substrate 10, and i-type amorphous semiconductor layer 21 and p-type amorphous semiconductor layer 22 are formed on back surface 10b. A method of forming each of i-type amorphous semiconductor layers 17i, 21, n-type amorphous semiconductor layer 17n, and p-type amorphous semiconductor layer 22 is not particularly limited. Each of i-type amorphous semiconductor layers 17i, 21, n-type amorphous semiconductor layer 17n, and p-type amorphous semiconductor layer 22 maybe formed by a CVD (Chemical Vapor Deposition) method such as a plasma CVD method, for example.

Then, in Step S3, insulation layer 16 is formed on n-type amorphous semiconductor layer 17n, and insulation layer 23 is formed on p-type amorphous semiconductor layer 22. Here, a method of forming each of insulation layers 16, 23 is not particularly limited. Each of insulation layers 16, 23 may be formed by the thin-film formation method such as the sputtering method and the CVD method, for example.

Figure 6:
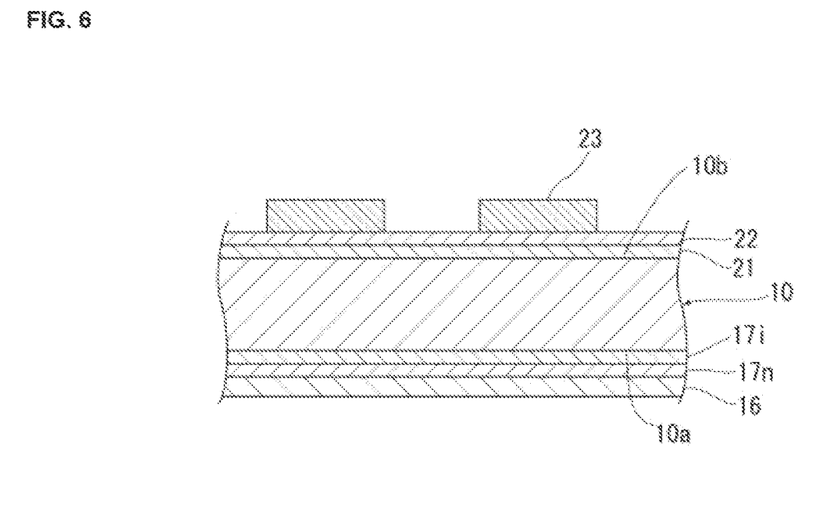
FIG. 6 is a schematic cross-sectional view for describing the steps of manufacturing the solar cell according to the first embodiment.

Thereafter, in Step S4, insulation layer 23 is partially removed by etching insulation layer 23. Specifically, a portion of insulation layer 23, which is located in a region where a p-type semiconductor layer is to be joined to semiconductor substrate 10 in a later step, is removed. Here, in the case where insulation layer 23 is made of silicon oxide, silicon nitride, or silicon oxynitride, insulation layer 23 may be etched using an acid etchant such as an HF aqueous solution.

Figure 7:
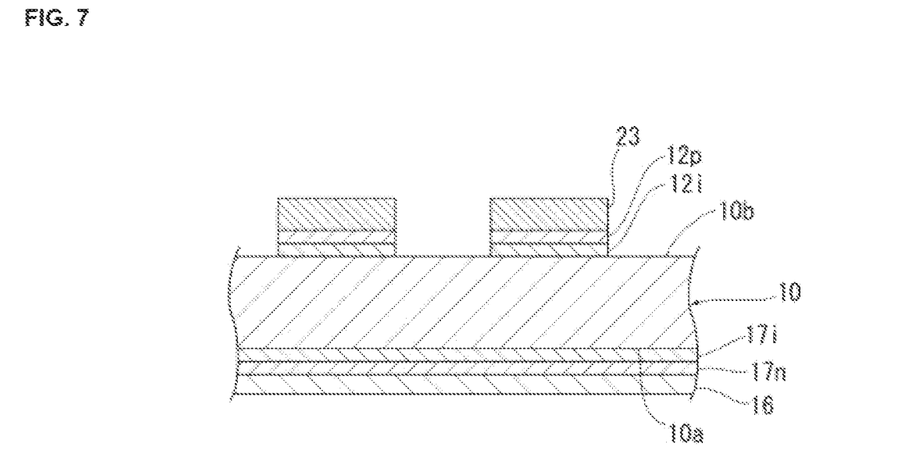
FIG. 7 is a schematic cross-sectional view for describing the steps of manufacturing the solar cell according to the first embodiment.

Next, in Step S5, by etching i-type amorphous semiconductor layer 21 and p-type amorphous semiconductor layer 22 with an alkali etchant while insulation layer 23 subjected to patterning in Step S4 is used as a mask, i-type amorphous semiconductor layer 21 and p-type amorphous semiconductor layer 22 are removed except for a portion covered with insulation layer 23. In this way, back surface 10b is exposed except for a portion over which insulation layer 23 is located, and i-type amorphous semiconductor layer 12i and p-type amorphous semiconductor layer 12p are formed out of semiconductor layers 21, 22.

Here, as described previously, insulation layer 23 is made of silicon oxide, silicon nitride, or silicon oxynitride in this embodiment. Hence, the etching rate of insulation layer 23 with an acid etchant is high but the etching rate of insulation layer 23 with an alkali etchant is low. On the other hand, semiconductor layers 21, 22 are made of amorphous silicon. Hence, the etching rate of each of semiconductor layers 21, 22 with an acid etchant is low but the etching rate of each of semiconductor layers 21, 22 with an alkali etchant is high. For this reason, the acid etchant used in Step S4 etches insulation layer 23 but does not substantially etch semiconductor layers 21, 22. Meanwhile, the alkali etchant used in Step S5 etches semiconductor layers 21, 22 but does not substantially etch insulation layer 23. Thus, it is possible to selectively etch either insulation layer 23 or semiconductor layers 21, 22 in Step S4 and Step S5.

As described above, through Steps S1 to S5, semiconductor substrate 10 is prepared in which the p-type semiconductor region having a p-type conductivity which is different from that of semiconductor substrate 10 and formed of p-type amorphous semiconductor layer 12p is provided in the portion of back surface 10b and insulation layer 23 is provided to cover the p-type semiconductor region.

Figure 8:
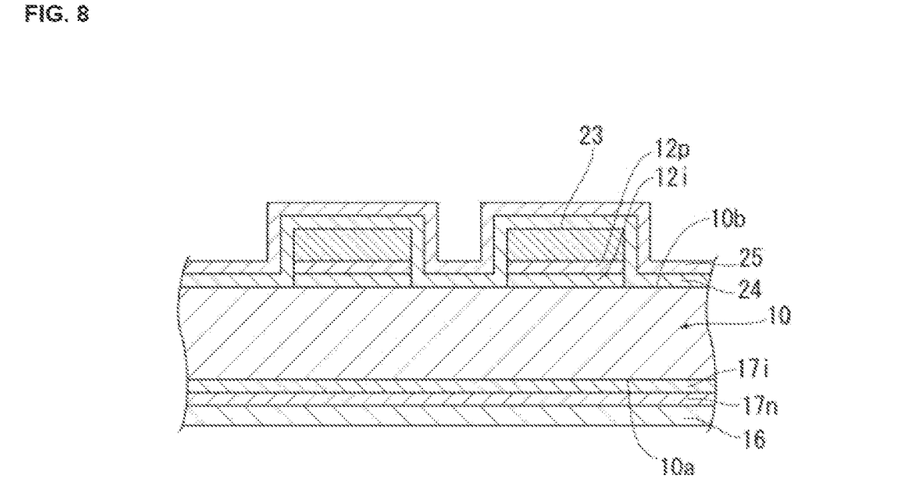
FIG. 8 is a schematic cross-sectional view for describing the steps of manufacturing the solar cell according to the first embodiment.

Next, in Step S6, i-type amorphous semiconductor layer 24 and n-type amorphous semiconductor layer 25 are formed sequentially in this order on substantially entirely on back surface 10b inclusive of a surface of insulation layer 23. A method of forming each of amorphous semiconductor layers 24, 25 is not particularly limited. Each of amorphous semiconductor layers 24, 25 may be formed by the thin-film formation method such as the CVD method.

Figure 9:
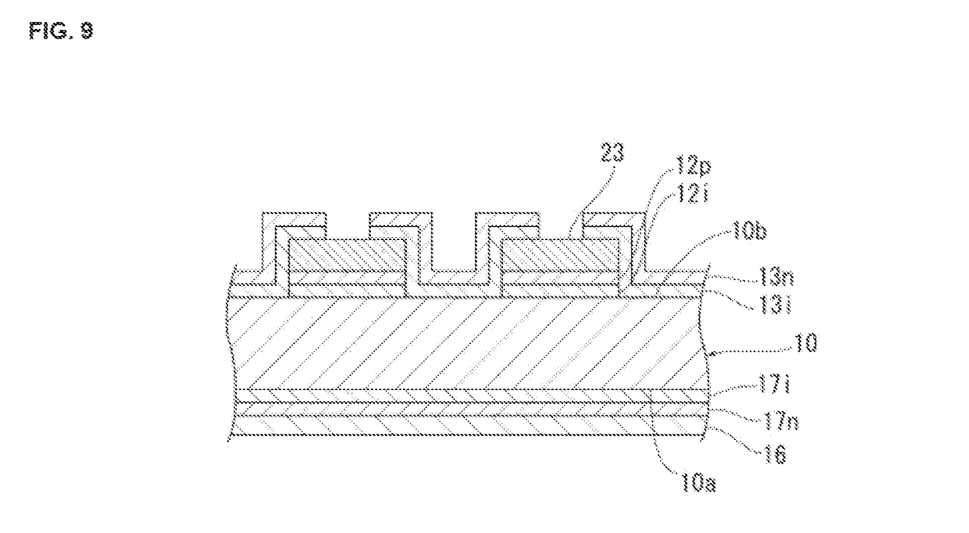
FIG. 9 is a schematic cross-sectional view for describing the steps of manufacturing the solar cell according to the first embodiment.

Subsequently, in Step S7, an opening is formed by etching and removing partially a portion of amorphous semiconductor layers 24, 25 located on or over insulation layer 23. In this way, i-type amorphous semiconductor layer 13i and n-type amorphous semiconductor layer 13n are formed out of amorphous semiconductor layers 24, 25.

Used in Step S7 is a first etching agent having an etching rate of amorphous semiconductor layers 24, 25 higher than the etching rate of insulation layer 23. Thereby, of insulation layer and amorphous semiconductor layers 24, 25, amorphous semiconductor layers 24, 25 are selectively etched.

The first etching agent is an etching agent having an etching rate of amorphous semiconductor layers 24, 25 preferably 1.1 times or more higher than, more preferably 1.5 or more higher than, still more preferably twice or more higher than, or further more preferably five times or more higher than the etching rate of insulation layer 23. Moreover, the first etching agent preferably is one with which amorphous semiconductor layers 24, 25 are etched but insulation layer 23 is not substantially etched. In the case where amorphous semiconductor layers 24, 25 are made of silicon and insulation layer 23 is made of silicon oxide, silicon nitride, or silicon oxynitride, specific examples of the first etching agent include alkaline aqueous solutions such as an NaOH aqueous solution containing NaOH and a KOH aqueous solution containing KOH, and a mixed acid of nitric acid and ammonia, for example. Further, the first etching agent does not necessarily have to be a liquid, i.e., an etchant, but may be gas, for example. Specific examples of an etching gas preferably used as the first etching agent include a mixed gas of $Cl_2$ and He and an $XeF_2$ gas, for example.

Note that, in the invention, the "etchant" includes etching paste in the form of paste and etching ink with adjusted viscosity.

Figure 10:
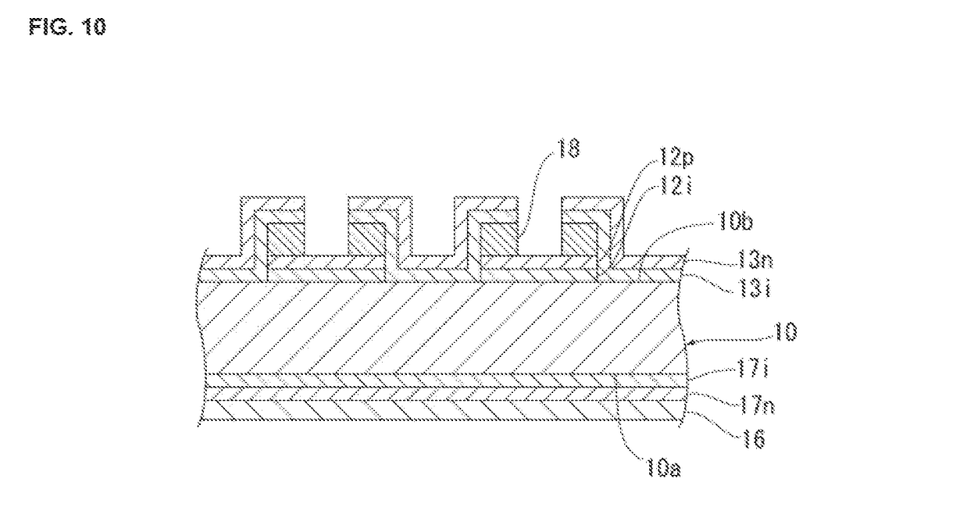
FIG. 10 is a schematic cross-sectional view for describing the steps of manufacturing the solar cell according to the first embodiment.

Then, in Step S8, insulation layer 23 is etched. Specifically, a surface of p-type amorphous semiconductor layer 12p is partially exposed by etching and removing insulation layer 23 exposed through the opening by use of a second etching agent while amorphous semiconductor layers 13i, 13p formed of amorphous semiconductor layers 24, 25 part of which is removed by the etching in Step S7 are used as a mask. In this way, a contact hole is formed in insulation layer 23 and p-type amorphous semiconductor layer 12p is exposed, and insulation layer 18 is formed out of insulation layer 23.

Used in Step S8 is a second etching agent having an etching rate of insulation layer 23 higher than the etching rate of amorphous semiconductor layers 24, 25. Thereby, of insulation layer 23 and amorphous semiconductor layers 24, 25, insulation layer 23 is selectively etched.

The second etching agent is an etching agent having an etching rate of insulation layer 23 preferably 1.1 times or more higher than, more preferably 1.5 times or more higher than, still more preferably twice or more higher than, or further more preferably five times or more higher than the etching rate of amorphous semiconductor layers 24, 25. Moreover, the second etching agent preferably is one with which insulation layer 23 is etched but amorphous semiconductor layers 24, 25 are not substantially etched. In the case where amorphous semiconductor layers 24, 25 are made of silicon and insulation layer 23 is made of silicon oxide, silicon nitride, or silicon oxynitride, specific examples of the second etching agent include acidic aqueous solutions such as an HF aqueous solution containing HF and a phosphoric acid aqueous solution, for example. Further, as in the case of the first etching agent, the second etching agent does not necessarily have to be a liquid, i.e., an etchant as well, but maybe gas, for example. Specific examples of an etching gas preferably used as the second etching agent include a mixed gas of $SF_6$ and He, a mixed gas of $CF_4$, $CHF_3$, and He, and an HF gas, for example. Among these, the HF aqueous solution is preferably used as the second etching agent. This is because using this enables an oxide film on each electrode formation surface to be removed before the formation of electrodes in Step S9.

Subsequently, in Step S9, an electrode formation step is performed in which p-side electrode 14 and n-side electrode 15 are formed on p-type amorphous semiconductor layer 12p and n-type amorphous semiconductor layer 13n, respectively. Thereby, solar cell 1 can be completed.

A method of forming each of n-side electrode 15 and p-side electrode 14 can be selected as appropriate depending on the material of each electrode. More specifically, in this embodiment, n-side electrode 15 and p-side electrode 14 are formed in the following manner.

Figure 11:
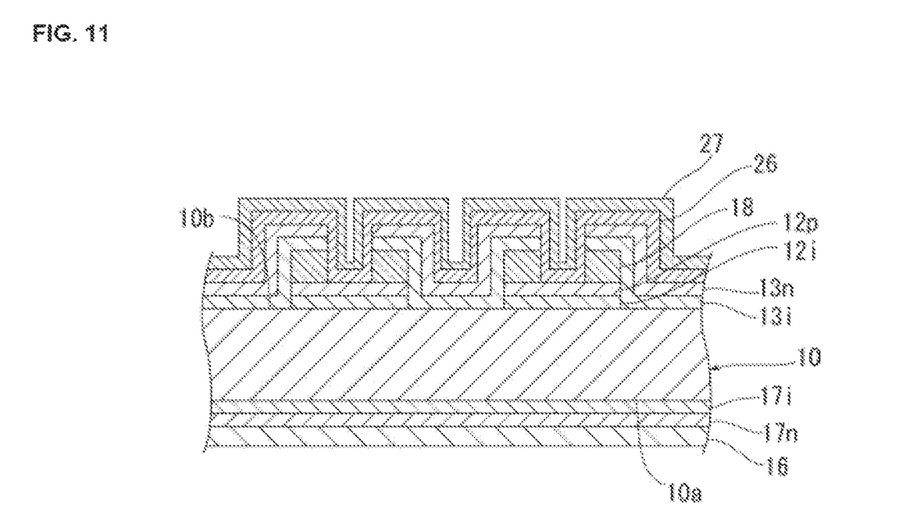
FIG. 11 is a schematic cross-sectional view for describing the steps of manufacturing the solar cell according to the first embodiment.

First, as illustrated in FIG. 11, conductive layer 26 made of TCO and conductive layer 27 made of metal, such as Cu, or an alloy are formed sequentially in this order by the thin-film formation method including the CVD (Chemical Vapor Deposition) method such as the plasma CVD method, the sputtering method, and the like.

Figure 12:
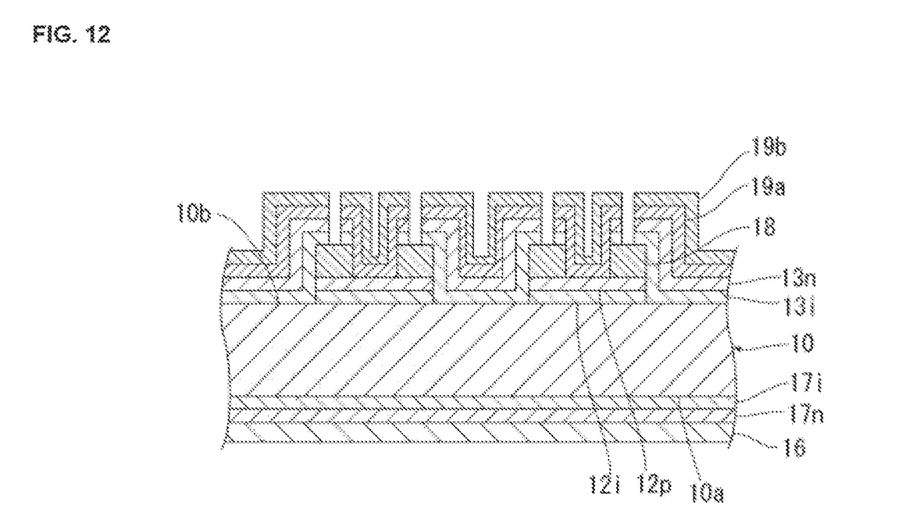
FIG. 12 is a schematic cross-sectional view for describing the steps of manufacturing the solar cell according to the first embodiment.

Next, as illustrated in FIG. 12, a portion of conductive layers 26, 27 located above insulation layer 18 is divided. Thereby, first and second conductive layers 19a, 19b are formed out of conductive layers 26, 27. Here, the division of conductive layers 26, 27 may be carried out by a photolithography method, for example.

In this manner, in this embodiment, a step of forming a portion of first conductive layer 19a located above p-type amorphous semiconductor layer 12p, and a step of forming a portion of first conductive layer 19a located on n-type amorphous semiconductor layer 13n, are carried out at the same time.

Then, third conductive layer 19c made of Cu and fourth conductive layer 19d made of Sn are formed sequentially on first and second conductive layers 19a, 19b which are formed on or above each of p-type amorphous semiconductor layer 12p and n-type amorphous semiconductor layer 13n. Thereby, n-side electrode 15 and p-side electrode 14 illustrated in FIG. 2 can be completed.

As described above, n-type amorphous semiconductor layer 13n serves to form a semiconductor junction between itself and semiconductor substrate 10, as well as serves as a mask layer for forming a contact hole in insulation layer 18. In other words, in this embodiment, a semiconductor layer for forming a semiconductor junction between itself and semiconductor substrate 10 and a mask layer for forming a contact hole are formed in a single step. This enables a reduction of manufacturing time of solar cell 1.

In addition, in this embodiment, the portion of amorphous semiconductor layers 24, 25 located on or over insulation layer 23 is partially selectively etched with the first etching agent. Then, p-type amorphous semiconductor layer 12p is exposed by etching and removing the portion of insulation layer 23 by use of the second etching agent while amorphous semiconductor layer 24 thus etched is used as a mask. Thus, unlike the case where p-type amorphous semiconductor layer 12p is exposed by etching and removing insulation layer 23 covered with amorphous semiconductor layers 24, 25 with an etching agent capable of etching insulation layer 23, for example, insulation layer 23 and amorphous semiconductor layers 24, 25 can be etched rapidly and easily. In fact, the time taken for insulation layer 23 and amorphous semiconductor layers 24, 25 to be etched when the method of this embodiment is used is about one-seventh to one-twelfth of the time taken for insulation layer 23 covered with amorphous semiconductor layers 24, 25 to be etched using HF capable of etching insulation layer 23. Accordingly, solar cell 1 can be manufactured easily in a short manufacturing time.

Here, it is also conceivable to expose p-type amorphous semiconductor layer 12p by etching insulation layer 23 and amorphous semiconductor layers 24, 25 at the same time with one type of etching agent, for example. However, an etching agent capable of etching amorphous semiconductor layers 24, 25 is generally capable of etching amorphous semiconductor layers 12i, 12n as well. For this reason, if insulation layer 23 and amorphous semiconductor layers 24, 25 are etched at the same time with the one type of etching agent, amorphous semiconductor layers 12i, 12n under insulation layer 23 are etched as well. Accordingly, exposing p-type amorphous semiconductor layer 12p by partially etching and removing insulation layer 23 and amorphous semiconductor layers 24, 25 can be realized only by using the first and second etching agents capable of selective etching as in this embodiment.

In this embodiment, insulation layer 23 is made of silicon oxide, silicon nitride, or silicon oxynitride. Accordingly, insulation layer 18 formed out of insulation layer 23 has high gas barrier properties. Thus, solar cell 1 excellent in weather resistance can be manufactured. Insulation layer 23 is more preferably made of silicon nitride in terms of achieving better weather resistance.

In addition, if insulation layer 23 contains hydrogen, the solubility of insulation layer 23 for an acid etchant is increased, and therefore the selective etching properties of insulation layer 23 can be improved. Accordingly, the damage of p-type amorphous semiconductor layer 12p and n-type amorphous semiconductor layer 13n in the etching of insulation layer 23 can be reduced. As a result, solar cell 1 with more excellent photoelectric conversion efficiency can be manufactured.

Further, in this embodiment, n-type amorphous semiconductor layer 13n is formed in such a way that p-type amorphous semiconductor layer 12p and n-type amorphous semiconductor layer 13n cover substantially entirely on back surface 10b of semiconductor substrate 10 formed of a crystalline semiconductor. Accordingly, no back surface 10b of semiconductor substrate 10 formed of a crystalline semiconductor is substantially exposed. This makes recombination of holes, being minority carriers, in back surface 10b of semiconductor substrate 10 less likely to occur, and thereby enables improvement of photoelectric conversion efficiency of solar cell 1 achieved as a result.

In this embodiment, third and fourth conductive layers 19c, 19d are formed by plating after first and second conductive layers 19a, 19b formed by the thin-film formation method are divided. Thus, the electrode division can be performed easier and in a shorter time than the case of division into n-side electrode 15 and p-side electrode 14 after formation of all of one to fourth conductive layers 19a to 19d, for example.

Moreover, because first and second conductive layers 19a, 19b are divided above insulation layer 18, p-type amorphous semiconductor layer 12p and n-type amorphous semiconductor layer 13n are less likely to be damaged when first and second conductive layers 19a, 19b are divided.

In addition, in this embodiment, insulation layer 18, n-side electrode 15, and p-side electrode 14 are formed in such a way that insulation layer 18, n-side electrode 15, and p-side electrode 14 substantially cover the entirety of p-type amorphous semiconductor layer 12p and n-type amorphous semiconductor layer 13n. Thereby, according to the manufacturing method of this embodiment, solar cell 1 more excellent in gas barrier properties and weather resistance can be manufactured.

In the meantime, in this embodiment, minority carriers are holes because semiconductor substrate 10 is of n-type. For this reason, it is important to suppress the disappearance of holes, being minority carriers, due to recombination in terms of improving the photoelectric conversion efficiency of solar cell 1.

Here, minority carriers generated below p-type amorphous semiconductor layer 12p, where the minority carriers are collected, have a short distance to travel before their power is collected by p-side electrode 14. For this reason, the minority carriers generated below p-type amorphous semiconductor layer 12p are less likely to disappear due to recombination before being collected by p-side electrode 14. On the other hand, minority carriers generated below n-type amorphous semiconductor layer 13n, where electrons being majority carriers are collected, have a long distance required to travel before their power is collected by p-side electrode 14. For this reason, the minority carriers generated below n-type amorphous semiconductor layer 13n are likely to disappear due to recombination before being collected by p-side electrode 14. Accordingly, in terms of suppressing recombination of minority carriers, it is preferable to make the widths of n-type amorphous semiconductor layer 13n and p-type amorphous semiconductor layer 12p smaller as well as to make the width of n-type amorphous semiconductor layer 13n smaller relative to that of p-type amorphous semiconductor layer 12p. By doing so, it is possible to shorten the distance required for minor carriers to travel before being collected by electrodes 14, 15.

However, in a semiconductor layer located under the insulation layer, a region for installing the insulation layer and a region for bringing the electrode and the semiconductor layer into contact with each other have to be provided. For this reason, the width of the semiconductor layer located under the insulation layer cannot be reduced so much. Hence, in the case where the semiconductor layer located under the insulation layer is the n-type amorphous semiconductor layer, for example, the width of the n-type amorphous semiconductor layer cannot be reduced enough, and therefore the photoelectric conversion efficiency cannot be improved enough.

On the other hand, in this embodiment, p-type amorphous semiconductor layer 12p is located under insulation layer 18 and no insulation layer is formed on n-type amorphous semiconductor layer 13n. This makes it easier to make the width of n-type amorphous semiconductor layer 13n smaller relative to that of p-type amorphous semiconductor layer 12p, and thereby makes it possible to shorten the distance required for holes generated below n-type amorphous semiconductor layer 13n to travel before being collected by p-side electrode 14. As a result, recombination of minority carriers can be suppressed and thus the photoelectric conversion efficiency of solar cell 1 can be improved.

Meanwhile, in terms of further improving the photoelectric conversion efficiency, width W1 is preferably 1.1 times or more larger than, and more preferably 1.5 times or more larger than width W2.

Note that, in this embodiment, the semiconductor layer located under insulation layer 18 is preferably of p-type because semiconductor substrate 10 is of n-type; however, if the semiconductor substrate is of p-type, the semiconductor layer located under the insulation layer is preferably of n-type. In other words, it is preferable that the semiconductor layer located under the semiconductor layer have a conductivity different from the semiconductor substrate.

Hereinafter, another example of the preferred embodiments for carrying out the invention is described. Note that, in the following description, a member having substantially the same function as that of the first embodiment is referred to by the same reference numeral and description thereof is omitted.

<Second Embodiment>

Figure 13:
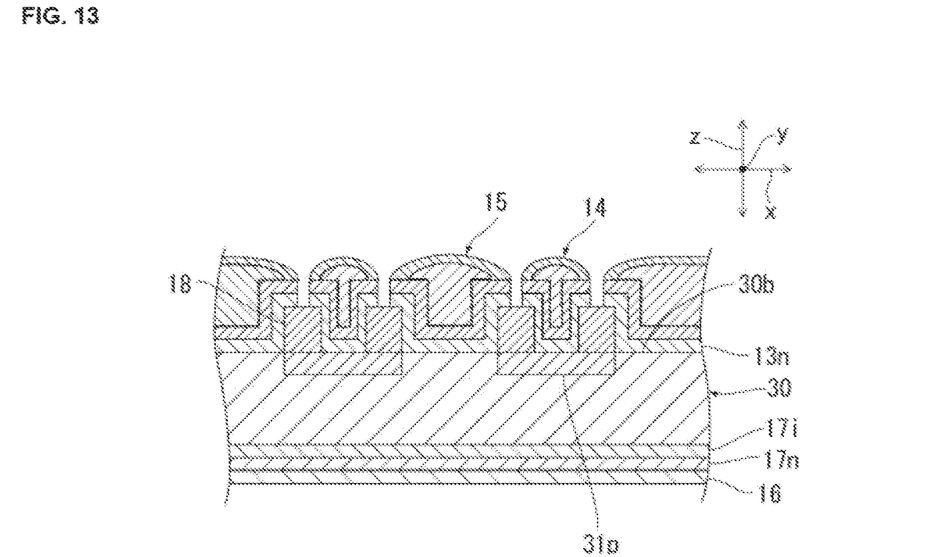
FIG. 13 is a schematic cross-sectional view of a solar cell according to a second embodiment.

FIG. 13 is a schematic cross-sectional view of a solar cell according to a second embodiment.

Figure 2:
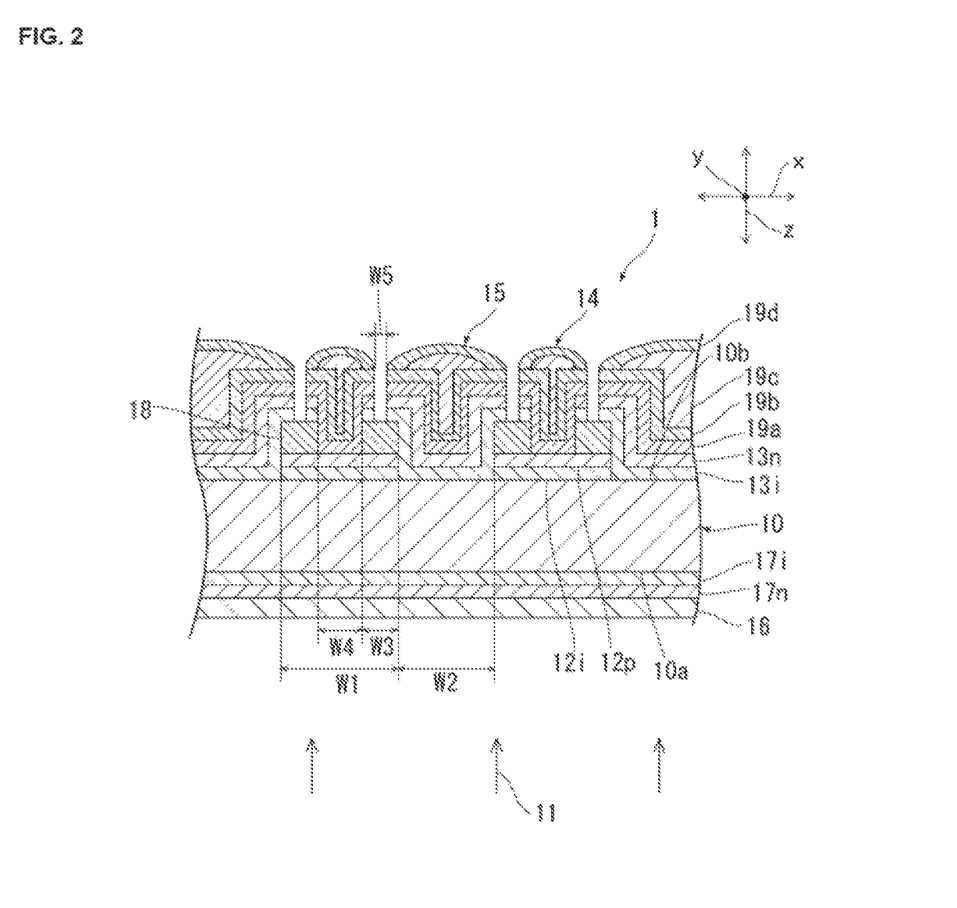
FIG. 2 is a schematic cross-sectional view taken along the line II-II of FIG. 1.

In the first embodiment described above, the description is given of the example in which a crystalline semiconductor substrate of n-type conductivity is used as semiconductor substrate 10 and p-type amorphous semiconductor layer 12p is formed on semiconductor substrate 10, as illustrated in FIG. 2. However, the invention is not limited to this configuration.

For example, as illustrated in FIG. 13, semiconductor region 31p formed of a p-type thermal diffusion region may be formed in a portion of n-type crystalline semiconductor substrate 30 on back surface 30b side by thermally diffusing a p-type dopant partially in the portion of back surface 30b of crystalline semiconductor substrate 30.

It is possible to complete a solar cell in this embodiment as well by carrying out Step S6 to Step S9 illustrated in FIG. 3 as in the first embodiment after semiconductor region 31p is formed.

Further, semiconductor region 31p can be made relatively large and the width of n-type amorphous semiconductor layer 13n can be made small in the solar cell of this embodiment as well. Accordingly, high photoelectric conversion efficiency can be achieved.

EXPLANATION OF REFERENCE NUMERALS 1 solar cell
10, 30 semiconductor substrate 10a light-receiving surface
10b back surface
12p p-type amorphous semiconductor layer
13n n-type amorphous semiconductor layer
14 p-side electrode
15 n-side electrode
16, 23 insulation layer
18 insulation layer
22 p-type amorphous semiconductor layer
25 n-type amorphous semiconductor layer
31p semiconductor region

The invention claimed is:

1. A method of manufacturing a solar cell comprising the steps of:
    preparing a semiconductor substrate of first conductivity including
        a first semiconductor region of second conductivity provided in a portion of a principal surface of the semiconductor substrate, and
        an insulation layer provided on a surface of the first semiconductor region,
    forming a second semiconductor layer of the first conductivity substantially entirely on the principal surface inclusive of a surface of the insulation layer,
    removing a portion of the second semiconductor layer located on the insulation layer with a first etching agent whose etching rate is higher for the second semiconductor layer than for the insulation layer and thereby forming an opening,
    removing the insulation layer exposed through the opening with a second etching agent whose etching rate is higher for the insulation layer than for the second semiconductor layer while using the second semiconductor layer as a mask and thereby partially exposing the surface of the first semiconductor region, and
    forming electrodes electrically connected to the surface of the first semiconductor region and to a surface of the second semiconductor layer, respectively.

2. The method of manufacturing a solar cell according to claim 1, wherein the first semiconductor region is formed of a first semiconductor layer formed on the portion of the principal surface.

3. The method of manufacturing a solar cell according to claim 2, wherein the second semiconductor layer is formed in such a way that the principal surface of the semiconductor substrate is substantially entirely covered with the first semiconductor layer or the second semiconductor layer.

4. The method of manufacturing a solar cell according to claim 3, wherein each of the first and second semiconductor layers is made of amorphous silicon containing hydrogen, and the insulation layer is made of silicon nitride, silicon oxide, or silicon oxynitride.

5. The method of manufacturing a solar cell according to claim 1, wherein the first semiconductor region is formed by diffusing a dopant of the second conductivity in the portion of the principal surface.

6. The method of manufacturing a solar cell according to claim 4, further comprising the step of forming an intrinsic amorphous silicon layer between the principal surface of the semiconductor substrate and each of the first and second semiconductor layers.

7. The method of manufacturing a solar cell according to claim 4, wherein the step of forming the electrodes includes the steps of:
    forming a first conductive layer over the surface of the first semiconductor region, the surface of the second semiconductor layer, and the surface of the insulation layer, and
    dividing a portion of the first conductive layer located above the insulation layer, and thereby electrically isolating a portion of the first conductive layer formed on the first semiconductor region, from a portion of the first conductive layer formed on the second semiconductor layer.

8. The method of manufacturing a solar cell according to claim 7, wherein the step of forming the electrodes includes the step of
    forming a second conductive layer on each of the portion of the first conductive layer formed on the first semiconductor region, and the portion of the first conductive layer formed on the second semiconductor layer.

9. The method of manufacturing a solar cell according to claim 1, wherein the second etching agent comprises an acid suitable to remove the insulation layer.

* * * * *